(12) United States Patent
Nakazumi et al.

(10) Patent No.: US 11,939,447 B2
(45) Date of Patent: Mar. 26, 2024

(54) THERMOSETTING COMPOSITION, PREPREG, METAL FOIL-CLAD LAMINATE, RESIN SHEET, AND PRINTED WIRING BOARD

(71) Applicant: MITSUBISHI GAS CHEMICAL COMPANY, INC., Tokyo (JP)

(72) Inventors: Yoshihiro Nakazumi, Tokyo (JP); Kentaro Takano, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 777 days.

(21) Appl. No.: 17/050,449

(22) PCT Filed: Apr. 2, 2019

(86) PCT No.: PCT/JP2019/014704
§ 371 (c)(1),
(2) Date: Oct. 25, 2020

(87) PCT Pub. No.: WO2019/208129
PCT Pub. Date: Oct. 31, 2019

(65) Prior Publication Data
US 2021/0238381 A1    Aug. 5, 2021

(30) Foreign Application Priority Data

Apr. 27, 2018   (JP) ................. 2018-086681

(51) Int. Cl.
| | |
|---|---|
| *H05K 1/03* | (2006.01) |
| *C08J 5/24* | (2006.01) |
| *C08K 3/01* | (2018.01) |
| *C08K 3/013* | (2018.01) |
| *C08K 3/38* | (2006.01) |

(52) U.S. Cl.
CPC ............... *C08K 3/013* (2018.01); *C08J 5/244* (2021.05); *C08J 5/249* (2021.05); *C08K 3/38* (2013.01); *H05K 1/0366* (2013.01); *C08K 2003/385* (2013.01); *H05K 2201/0209* (2013.01)

(58) Field of Classification Search
CPC ............................. H05K 1/0366; C08K 3/013
See application file for complete search history.

(56) References Cited

U.S. PATENT DOCUMENTS

| | | |
|---|---|---|
| 10,550,228 B2 | 2/2020 | Kashima et al. |
| 2009/0203279 A1 | 8/2009 | Mori et al. |
| 2013/0143981 A1 | 6/2013 | Miyata et al. |
| 2015/0044484 A1 | 2/2015 | Ito et al. |
| 2019/0153177 A1 | 5/2019 | Nakazumi et al. |

FOREIGN PATENT DOCUMENTS

| | | |
|---|---|---|
| CN | 103068875 A | 4/2013 |
| EP | 3375822 A1 | 9/2018 |
| JP | 2009-138075 A | 6/2009 |
| JP | 2010-138364 A | 6/2010 |
| JP | 2010-174242 A | 8/2010 |
| JP | 2012-131947 A | 7/2012 |
| JP | 2018-062568 A | 4/2018 |
| TW | 201348308 A | 12/2013 |
| WO | 2012026012 A | 3/2012 |
| WO | 2017006891 A | 1/2017 |
| WO | 2018038179 A1 | 3/2018 |
| WO | 2018030124 A1 | 6/2019 |

*Primary Examiner* — Jeremy C Norris
(74) *Attorney, Agent, or Firm* — Renner, Kenner; Arthur M. Reginelli

(57) ABSTRACT

A thermosetting composition including a thermosetting compound and hexagonal boron nitride D, wherein the thermosetting compound contains a cyanate compound A and/or a maleimide compound B, and a modified polyphenylene ether C having a substituent with a carbon-carbon unsaturated double bond at at least one terminal, and a content of the hexagonal boron nitride D is 0.1 parts by mass or more and 25 parts by mass or less based on 100 parts by mass of the thermosetting compound.

14 Claims, No Drawings

THERMOSETTING COMPOSITION, PREPREG, METAL FOIL-CLAD LAMINATE, RESIN SHEET, AND PRINTED WIRING BOARD

TECHNICAL FIELD

The present invention relates to a thermosetting composition, a prepreg, a metal foil-clad laminate, a resin sheet, and a printed wiring board.

BACKGROUND ART

In recent years, higher integration and miniaturization of semiconductors used in communication equipment, communication instruments, personal computers, and the like have advanced. Laminates for producing printed wiring boards used in such semiconductors are required to have high-level characteristics. Mainly, examples of the required characteristics include peel strength, heat resistance after moisture absorption, low dielectric constant, low dielectric loss tangent, thermal conductivity, and drilling processability.

In order to obtain a printed wiring board in which the above characteristics are improved, a resin composition used as the material of a printed wiring board has been examined. Patent Literature 1 discloses a resin composition comprising an allyl group-containing compound having a predetermined reactive functional group and a maleimide compound. This literature discloses that the resin composition can improve characteristics including low dielectric constant, thermal conductivity, copper foil peel strength, and heat resistance after moisture absorption by containing the above allyl group-containing compound.

Patent Literature 2 discloses an epoxy resin composition for a printed wiring board comprising an epoxy resin, an inorganic filler, a resin having a polybutadiene skeleton, and a predetermined inorganic filler. This literature discloses that when a metal foil-clad laminate is produced by using the epoxy resin composition comprising the above each component, the metal foil-clad laminate to be obtained can improve the characteristics including drilling and laser perforation processability and peeling strength of copper foil. This literature discloses, in Examples 5 and 6, a resin composition in which an epoxy resin, a cyanate resin, and a resin having a polybutadiene skeleton, as well as scaly boron nitride are combined, and the content of the scaly boron nitride is 100 parts by mass based on the total amount of 100 parts by mass of each resin.

Patent Literature 3 discloses a resin composition comprising a thermosetting resin and an inorganic filler, wherein the content of the inorganic filler in the resin composition is within a predetermined range, and the content of the specific inorganic filler in the inorganic filler is within a predetermined range. This literature discloses that the resin composition has excellent characteristics including drilling processability with the above configuration. This literature discloses in Example 3 that a phenol novolac-based epoxy resin as the thermosetting resin and hexagonal boron nitride as the specific inorganic filler are combined, and the content of the hexagonal boron nitride is about 14 parts by mass based on 100 parts by mass of the thermosetting resin, the curing agent, and the curing accelerator.

CITATION LIST

Patent Literature

Patent Literature 1: WO 2017/006891
Patent Literature 2: Japanese Patent Laid-Open No. 2012-131947
Patent Literature 3: Japanese Patent Laid-Open No. 2009-138075

SUMMARY OF INVENTION

Technical Problem

However, in Patent Literature 1, the improvement in drilling processability is not examined, and in Patent Literature 3, the improvement in peel plating strength is not examined.

On the other hand, Patent Literature 2 discloses, as in Examples 5 and 6, that when an epoxy resin, a cyanate resin, and a resin having a polybutadiene skeleton, as well as scaly boron nitride are combined in a predetermined proportion, drilling processability and copper foil peeling strength are excellent. Typically, as described in paragraph 0005 of Patent Literature 2, the copper foil peeling strength is considered to be decreased when the content of the hexagonal boron nitride is increased. In this regard, since the resin having a polybutadiene skeleton has rubber elasticity, containing this resin enables the resin composition of this literature to solve the problem of the decrease in copper foil peeling strength due to the increase in the content of the hexagonal boron nitride. However, the increase in the content of the resin having rubber elasticity causes a problem of insufficient heat resistance after moisture absorption.

Thus, an object of the present inventions is to provide a thermosetting composition excellent in peel strength, heat resistance after moisture absorption, dielectric loss tangent, thermal conductivity, moldability, and drilling processability, and, a prepreg using the thermosetting composition, a metal foil-clad laminate, a resin sheet, and a printed wiring board.

Solution to Problem

The present inventors have diligently studied in order to solve the above problems, and as a result, have found that the above problems can be solved by combining a predetermined thermosetting compound with hexagonal boron nitride, and setting the content of the hexagonal boron nitride to the thermosetting compound within a predetermined range, and thereby completed the present invention.

More specifically, the present invention is as follows.

[1]
A thermosetting composition comprising:
a thermosetting compound; and
a hexagonal boron nitride D,
wherein the thermosetting compound contains a cyanate compound A and/or a maleimide compound B, and a modified polyphenylene ether C having a substituent with a carbon-carbon unsaturated double bond at at least one terminal, and
a content of the hexagonal boron nitride D is 0.1 parts by mass or more and 25 parts by mass or less based on 100 parts by mass of the thermosetting compound.

[2]
The thermosetting composition according to [1] further comprising an inorganic filler E other than the hexagonal boron nitride D,
wherein the inorganic filler E contains one or more selected from the group consisting of aluminum oxide, boehmite, talc, silica, and mica.

[3]
The thermosetting composition according to [1] or [2], wherein the cyanate compound A contains at least one cyanate compound of a naphthol aralkyl-based cyanate compound represented by the following formula (1) and a biphenyl aralkyl-based cyanate compound represented by the following formula (2),

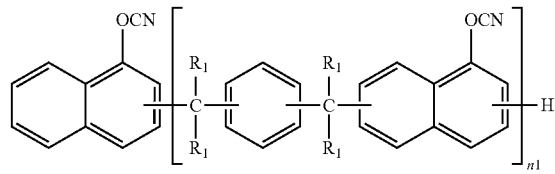

(1)

wherein $R_1$ each independently represents a hydrogen atom or a methyl group; and n1 represents an integer of 1 to 50,

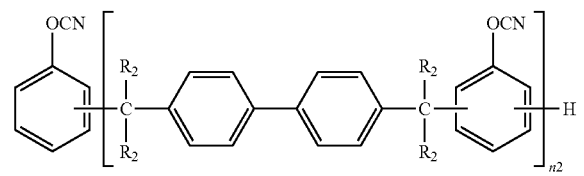

(2)

wherein $R_2$ each independently represents a hydrogen atom or a methyl group; and n2 represents an integer of 1 to 50.

[4]
The thermosetting composition according to any one of [1] to [3], wherein a content of the cyanate compound A is 1 to 90 parts by mass based on 100 parts by mass of the thermosetting compound.

[5]
The thermosetting composition according to any one of [1] to [4], wherein the maleimide compound B contains one or more selected from the group consisting of 2,2-bis(4-(4-maleimidophenoxy)-phenyl)propane, bis(3-ethyl-5-methyl-4-maleimidophenyl)methane, and a maleimide compound represented by the following formula (3),

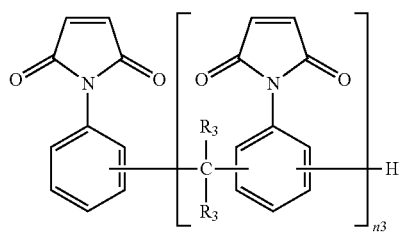

(3)

wherein $R_3$ each independently represents a hydrogen atom or a methyl group; and n3 represents an integer of 1 or more.

[6]
The thermosetting composition according to any one of [1] to [5], wherein a content of the maleimide compound B is 1 to 90 parts by mass based on 100 parts by mass of the thermosetting compound.

[7]
The thermosetting composition according to any one of [1] to [6], wherein the modified polyphenylene ether C contains a compound represented by the following formula (4),

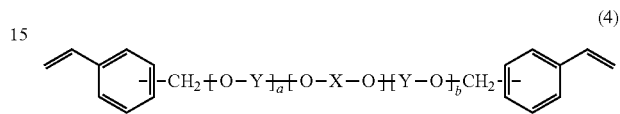

(4)

wherein X represents a group represented by the following formula (5) or the following formula (6); Y each independently represents a group represented by the following formula (7); a and b each independently represent an integer of 0 to 100, and at least one of a and b is 1 or more,

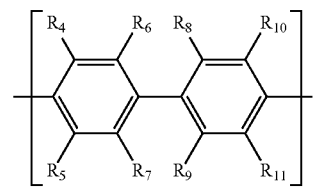

(5)

wherein $R_4$, $R_5$, $R_6$, $R_{10}$, and $R_{11}$ each independently represent a halogen atom, an alkyl group having 1 to 6 carbon atoms, or a phenyl group; and $R_7$, $R_8$, and $R_9$ each independently represent a hydrogen atom, a halogen atom, an alkyl group having 1 to 6 carbon atoms, or a phenyl group,

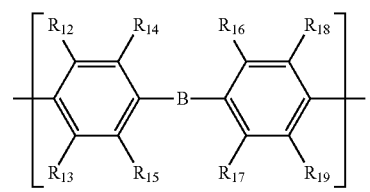

(6)

wherein $R_{12}$, $R_{13}$, $R_{14}$, $R_{15}$, $R_{16}$, $R_{17}$, $R_{18}$, and $R_{19}$ each independently represent a hydrogen atom, a halogen atom, an alkyl group having 1 to 6 carbon atoms, or a phenyl group; and —B— represents a linear, branched, or cyclic divalent hydrocarbon group having 1 to 20 carbon atoms,

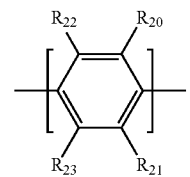

(7)

wherein $R_{20}$ and $R_{21}$ each independently represent a halogen atom, an alkyl group having 1 to 6 carbon atoms, or a phenyl group; and $R_{22}$ and $R_{23}$ each independently represent a hydrogen atom, a halogen atom, an alkyl group having 1 to 6 carbon atoms, or a phenyl group.

[8]

The thermosetting composition according to any one of [1] to [7], wherein a content of the modified polyphenylene ether C is 1 to 90 parts by mass based on 100 parts by mass of the thermosetting compound.

[9]

The thermosetting composition according to any one of [2] to [8], wherein a content of the inorganic filler E is 1 to 1600 parts by mass based on 100 parts by mass of the thermosetting compound.

[10]

The thermosetting composition according to any one of [1] to [9], wherein a content of the hexagonal boron nitride D is 0.3 parts by mass or more and 15 parts by mass or less based on 100 parts by mass of the thermosetting compound.

[11]

A prepreg comprising:
a base material; and
the thermosetting composition according to any one of [1] to [10] with which the base material is impregnated or coated.

[12]

A metal foil-clad laminate comprising:
at least one or more of the prepreg according to [11] laminated; and
a metal foil disposed on one surface or both surfaces of the prepreg.

[13]

A resin sheet comprising:
a support, and
the thermosetting composition according to any one of [1] to [10] disposed on a surface of the support.

[14]

A printed wiring board comprising:
an insulating layer; and
a conductor layer formed on a surface of the insulating layer,
wherein the insulating layer comprises the thermosetting composition according to any one of [1] to [10].

Advantageous Effects of Invention

According to the present invention, a thermosetting composition excellent in peel strength, heat resistance after moisture absorption, dielectric loss tangent, thermal conductivity, moldability, and drilling processability, and a prepreg using the thermosetting composition, a metal foil-clad laminate, a resin sheet, and a printed wiring board can be provided.

DESCRIPTION OF EMBODIMENTS

Hereinafter, embodiments of the present invention (hereinafter, also referred to as the "this embodiment") will be described in detail. The embodiments described below are given merely for illustrating the present invention. The present invention is not limited only by these embodiments.

[Thermosetting Composition]

A thermosetting composition in this embodiment comprises a thermosetting compound; and a hexagonal boron nitride D, wherein the thermosetting compound contains a cyanate compound A and/or a maleimide compound B, and a modified polyphenylene ether C having a substituent with a carbon-carbon unsaturated double bond at at least one terminal. The content of the hexagonal boron nitride D is 0.1 parts by mass or more and 25 parts by mass or less based on 100 parts by mass of the thermosetting compound. In the present specification, the modified polyphenylene ether C having a substituent with a carbon-carbon unsaturated double bond at at least one terminal is also simply referred to as the "modified polyphenylene ether C."

With the above configuration, the thermosetting composition in this embodiment can simultaneously satisfy excellent peel strength, heat resistance after moisture absorption, low dielectric loss tangent, moldability, and drilling processability when used as a printed wiring board material (for example, a laminate and a metal foil-clad laminate), and the like. With the above configuration, the thermosetting composition in this embodiment can also obtain, for example, a high thermal conductivity when used as a printed wiring board material, and the like.

[Thermosetting Compound]

The thermosetting compound in this embodiment contains the cyanate compound A and/or the maleimide compound B, and the modified polyphenylene ether C as essential constituent elements. The thermosetting compound may be composed of only the cyanate compound A and/or the maleimide compound B and the modified polyphenylene ether C, or may further contain other compounds having a thermosetting property.

[Cyanate Compound (A)]

The cyanate compound A in this embodiment is not particularly limited as long as it is a compound having at least one cyanate group. Above all, a compound having a structure in which at least one hydrogen atom in an aromatic group is replaced with a cyanate group is preferred. Examples of such a cyanate compound A include, but are not limited to, a compound represented by the following formula (A):

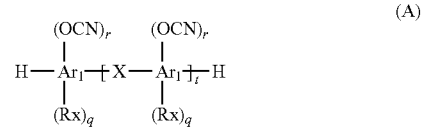

(A)

wherein $Ar_1$ each independently represents an aromatic ring. Examples of the above aromatic ring include, but are not particularly limited to, a benzene ring, a naphthalene ring, an anthracene ring, and a biphenyl ring. Rx each independently represents a hydrogen atom, an alkyl group having 1 to 6 carbon atoms, an aryl group having 6 to 12 carbon atoms, or an alkoxyl group having 1 to 4 carbon atoms. The aryl group in Rx may have a substituent. The bonding position of the substituent in $Ar_1$ and Rx may be optional. r represents the number of cyanate groups bonded to $Ar_1$ and each independently represents an integer of 1 to 3. q represents the number of Ra bonded to $Ar_1$ and is each independently 4−r when $Ar_1$ is a benzene ring, 6−r when $Ar_1$ is a naphthalene ring, and 8−r when $Ar_1$ is two benzene rings bonded to each other by a single bond. t represents the average number of repeat units and may be in the range of 0 to 50. X each independently represents any of a single bond, a divalent organic group having 1 to 50 carbon atoms in which a hydrogen atom may be replaced by a heteroatom, a divalent organic group having 1 to 10 nitrogen atoms, a carbonyl group (—CO—), a carboxy group (—C(=O)

O—), a carbonyl dioxide group (—OC(=O)O—), a sulfonyl group (—SO2-), a divalent sulfur atom, or a divalent oxygen atom.

The alkyl group having 1 to 6 carbon atoms in Rx may have a linear, branched or cyclic structure. Specific examples of the alkyl group having 1 to 6 carbon atoms include a methyl group, an ethyl group, a propyl group, an isopropyl group, a n-butyl group, an isobutyl group, a tert-butyl group, a n-pentyl group, a 1-ethylpropyl group, a 2,2-dimethylpropyl group, a cyclopentyl group, a hexyl group, and a cyclohexyl group. These alkyl groups may have a substituent, and examples of the alkyl group having a substituent include a trifluoromethyl group.

Examples of the aryl group having 6 to 12 carbon atoms in Rx include a phenyl group and a naphthyl group. These aryl groups may have a substituent, and examples of the aryl group having a substituent include a xylyl group, a mesityl group, a phenoxyphenyl group, an ethylphenyl group, an o-, m-, or p-fluorophenyl group, a dichlorophenyl group, a dicyanophenyl group, a trifluorophenyl group, a methoxyphenyl group, and an o-, m-, or p-tolyl group.

Examples of the alkoxyl group having 1 to 4 carbon atoms in Rx include a methoxy group, an ethoxy group, a propoxy group, an isopropoxy group, a n-butoxy group, an isobutoxy group, and a tert-butoxy group.

Examples of the divalent organic group having 1 to 10 nitrogen atoms in X include a group represented by the formula —N—R—N— (wherein R represents a divalent organic group), an imino group, and a polyimide group.

Examples of the organic group of X include a structure represented by the following formula (B) or the following formula (C):

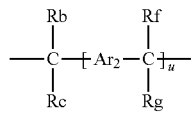

(B)

wherein $Ar_2$ represents a benzene ring, a naphthalene ring, or a biphenyl ring, and may be the same as or different from each other when u is 2 or more. Each aromatic ring may have a substituent, and represents, as a substituent, an alkyl group having 1 to 6 carbon atoms, an aryl group having 6 to 12 carbon atoms, a trifluoromethyl group, or an aryl group having one or more phenolic hydroxyl groups. Examples of the alkyl group include alkyl groups exemplified as the alkyl group in Rx, and examples of the aryl group include aryl groups exemplified as the aryl group in Rx.

Rb, Rc, Rf, and Rg each independently represent a hydrogen atom, an alkyl group having 1 to 6 carbon atoms, an aryl group having 6 to 12 carbon atoms, a trifluoromethyl group, or an aryl group having at least one phenolic hydroxyl group. Examples of the alkyl group include alkyl groups exemplified as the alkyl group in Rx, and examples of the aryl group include aryl groups exemplified as the aryl group in Rx. u represents an integer of 0 to 5.

(c)

wherein $Ar_3$ represents a benzene ring, a naphthalene ring, or a biphenyl ring, and may be the same as or different from each other when v is 2 or more. Each aromatic ring may have a substituent, and represents, as a substituent, an alkyl group having 1 to 6 carbon atoms, an aryl group having 6 to 12 carbon atoms, a trifluoromethyl group, or an aryl group having one or more phenolic hydroxyl groups. Examples of the alkyl group include alkyl groups exemplified as the alkyl group in Rx, and examples of the aryl group include aryl groups exemplified as the aryl group in Rx. v represents an integer of 0 to 5.

The divalent organic group may be, for example, the groups represented by the following formula:

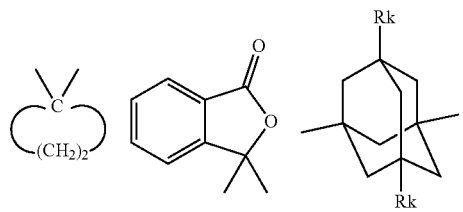

wherein z represents an integer of 4 to 7. Rk each independently represents a hydrogen atom or an alkyl group having 1 to 6 carbon atoms.

Specific examples of the compound represented by the formula (A) include compounds described in paragraph 0039 of Japanese Patent Laid-Open No. 2017-200966. Among these, from the viewpoint of improving a high glass transition temperature (hereinafter, also referred to as a "high Tg"), low dielectric characteristics, and flame retardancy in a well-balanced manner, the cyanate compound A is preferably one or more selected from the group consisting of phenol novolac-based cyanate compounds, naphthol aralkyl-based cyanate compounds, biphenyl aralkyl-based cyanate compounds, naphthylene ether-based cyanate compounds, xylene resin-based cyanate compounds, and adamantane skeleton-based cyanate compounds, and more preferably one or more selected from the group consisting of naphthol aralkyl-based cyanate compounds and biphenyl aralkyl-based cyanate compounds.

From the viewpoint of improving a high Tg, low dielectric characteristics, and flame retardancy in a well-balanced manner, the naphthol aralkyl-based cyanate compound is preferably the compound represented by the following formula (1).

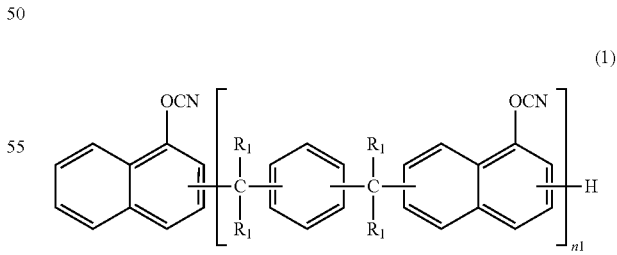

(1)

wherein $R_1$ each independently represents a hydrogen atom or a methyl group; and n1 represents an integer of 1 to 50, preferably an integer of 1 to 30, and more preferably an integer of 1 to 10.

From the viewpoint of improving a high Tg, low dielectric characteristics, peel strength, and flame retardancy in a well-balanced manner, the biphenyl aralkyl-based cyanate compound is preferably the compound represented by the following formula (2).

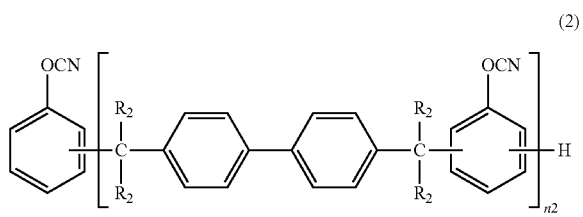

wherein $R_2$ each independently represents a hydrogen atom or a methyl group; and n2 represents an integer of 1 to 50, preferably an integer of 1 to 30, and more preferably an integer of 1 to 10.

The content of the cyanate compound A in this embodiment is preferably 1 to 90 parts by mass, more preferably 5 to 85 parts by mass, and further preferably 10 to 80 parts by mass based on 100 parts by mass of the thermosetting compound. When the content of the cyanate compound A is within the above range, the Tg and the flame retardancy tend to improve more while maintaining the dielectric characteristics (dielectric constants and dielectric loss tangent).

Examples of methods for preparing the cyanate compound A in this embodiment include, but are not particularly limited to, a method of reacting a compound having a hydroxyl group with cyanogen halide. More specifically, examples thereof include a method of cyanation of the hydrogen atom in the phenolic hydroxyl group by reacting a compound having one or more phenolic hydroxyl groups with cyanogen halide such as cyanogen chloride and cyanogen bromide in the presence of a basic compound. More specifically, reference can be made to U.S. Pat. Nos. 3,553,244, 3,319,061, 3,905,559, 4,055,210, 2,991,054, 5,026,727, and the like. The compound represented by the formula (X) (precursor compound B) can be prepared according to known methods (for example, methods described in U.S. Pat. Nos. 2,808,034, 3,351,029, and the like).

[Maleimide Compound B]

The maleimide compound B in this embodiment is not particularly limited as long as it is a compound having one or more maleimide groups in a molecule. Examples of the maleimide compound B include phenylmethane maleimide, m-phenylene bismaleimide, 2,2-bis(4-(4-maleimidophenoxy)-phenyl)propane, bis(3-ethyl-5-methyl-4-maleimidophenyl)methane, 3,3'-dimethyl-5,5'-diethyl-4,4'-diphenylmethane bismaleimide, 4-methyl-1,3-phenylene bismaleimide, 1,6'-bismaleimide-(2,2,4-trimethyl)hexane, 4,4'-diphenyl ether bismaleimide, 4,4-diphenyl sulfone bismaleimide, 1,3-bis(3-maleimidephenoxy)benzene, 1,3-bis(4-maleimidephenoxy)benzene, polyphenylmethanemaleimide, novolac-based maleimide, and biphenyl aralkyl-based maleimide; prepolymers of these maleimide compounds or prepolymers of maleimide compounds and amine compounds; and the maleimide compound represented by the following formula (3) and the maleimide compound represented by the following formula (3-1). These maleimide compounds are used singly or in combination of two or more.

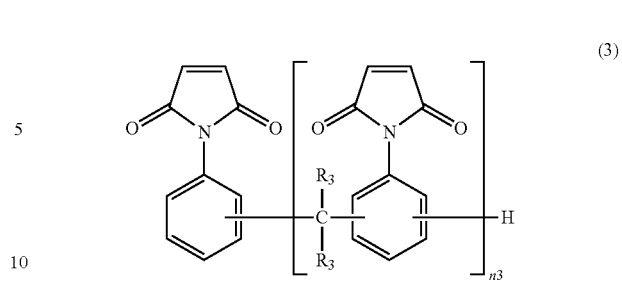

wherein $R_3$ each independently represents a hydrogen atom or a methyl group; and n3 represents an integer of 1 or more. n3 preferably represents an integer of 1 to 30, and more preferably represents an integer of 1 to 10. Examples of the compound represented by the formula (3) include bis(4-maleimidophenyl)methane.

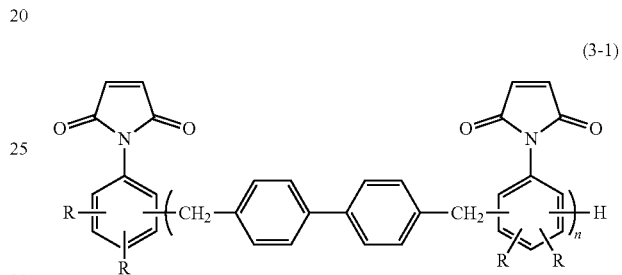

wherein R each independently represents a hydrogen atom, an alkyl group having 1 to 5 carbon atoms, or a phenyl group; and n is an average value and represents $1<n \le 5$.

Among these, from the viewpoint of heat resistance, the maleimide compound preferably contains one or more selected from the group consisting of 2,2-bis(4-(4-maleimidophenoxy)-phenyl)propane, bis(3-ethyl-5-methyl-4-maleimidophenyl)methane, and the maleimide compound represented by the above formula (3).

The maleimide compound B may be prepared by a known method, or a commercial product may also be used. Examples of the commercial product include "BMI1000", "BMI2000", "BMI3000", "BMI4000", and "BMI5100" manufactured by Daiwa Kasei Industry Co., Ltd., "BMI", "BMI-70", and "BMI-80" manufactured by K•I Chemical Industry Co., LTD., and "MIR-3000" manufactured by Nippon Kayaku Co., Ltd.

The content of the maleimide compound B in this embodiment is preferably 1 to 90 parts by mass, more preferably 5 to 85 parts by mass, and further preferably 10 to 80 parts by mass based on 100 parts by mass of the thermosetting compound. When the content of the maleimide compound B is within the above range, the coefficient of thermal expansion of the obtained cured product tends to decrease more, and the heat resistance tends to improve more.

[Modified Polyphenylene Ether C]

The modified polyphenylene ether C is a polyphenylene ether having a substituent with a carbon-carbon unsaturated double bond at at least one terminal. The "polyphenylene ether" used in the present specification refers to a compound having a polyphenylene ether skeleton represented by the following formula (X1).

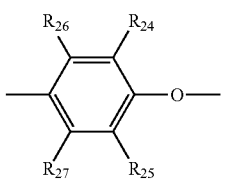

(X1)

wherein $R_{24}$, $R_{25}$, $R_{26}$, and $R_{27}$ each independently represent an alkyl group having 1 to 6 carbon atoms, an aryl group, a halogen atom, or a hydrogen atom.

Examples of the alkyl group having 1 to 6 carbon atoms include a methyl group, an ethyl group, a propyl group, an isopropyl group, a n-butyl group, an isobutyl group, a sec-butyl group, a tert-butyl group, a n-pentyl group, and a n-hexyl group. Examples of the aryl group include a phenyl group and a naphthyl group.

The modified polyphenylene ether C may further comprise the repeat unit represented by the following formula (X2) and/or the repeat unit represented by the following formula (X3).

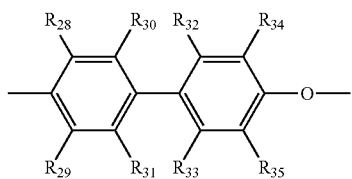

(X2)

wherein $R_{28}$, $R_{29}$, $R_{30}$, $R_{34}$, and $R_{35}$ each independently represent a halogen atom, an alkyl group having 1 to 6 carbon atoms, or a phenyl group. $R_{31}$, $R_{32}$, and $R_{33}$ each independently represent a hydrogen atom, a halogen atom, an alkyl group having 1 to 6 carbon atoms, or a phenyl group. Examples of the alkyl group having 1 to 6 carbon atoms include a methyl group, an ethyl group, a propyl group, an isopropyl group, a n-butyl group, an isobutyl group, a sec-butyl group, a tert-butyl group, a n-pentyl group, and a n-hexyl group.

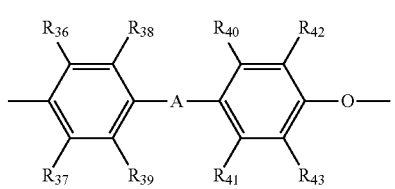

(X3)

wherein $R_{36}$, $R_{37}$, $R_{38}$, $R_{39}$, $R_{40}$, $R_{41}$, $R_{42}$, and $R_{43}$ each independently represents a hydrogen atom, an alkyl group having 1 to 6 carbon atoms, or a phenyl group. -A- represents a linear, branched, or cyclic divalent hydrocarbon group having 1 to 20 carbon atoms. Examples of the alkyl group having 1 to 6 carbon atoms include a methyl group, an ethyl group, a propyl group, an isopropyl group, a n-butyl group, an isobutyl group, a sec-butyl group, a tert-butyl group, a n-pentyl group, and a n-hexyl group.

At least a part of the structure of the above polyphenylene ether may be modified with an ethylenic unsaturated group such as a vinylbenzyl group, or a functional group such as an epoxy group, an amino group, a hydroxyl group, a mercapto group, a carboxyl group, and a silyl group. These functional groups may be used singly or in combination of two or more. Examples of the polyphenylene ether having a hydroxyl group at the terminal include SA90 manufactured by SABIC Innovative Plastics.

A known method can be applied to the method of producing the modified polyphenylene ether C. Specific examples of the production method include a method of producing one functionalized with a vinylbenzyl group by dissolving a bifunctional phenylene ether oligomer and vinylbenzyl chloride in a solvent, adding and reacting a base under heating and stirring, and then solidifying a resin. One functionalized with a carboxyl group is produced by melt-kneading and reacting polyphenylene ether with an unsaturated carboxylic acid or a functionalized derivative thereof, for example, in the presence or absence of a radical initiator. Alternatively, it is produced by dissolving polyphenylene ether and an unsaturated carboxylic acid or a functional derivative thereof in an organic solvent in the presence or absence of a radical initiator and reacting them in a solution.

The polyphenylene ether C has a substituent with a carbon-carbon unsaturated double bond (for example, an ethylenic unsaturated group) at at least one terminal of the polyphenylene ether, and preferably has a substituent with a carbon-carbon unsaturated double bond at both terminals thereof. Examples of the ethylenic unsaturated group include an alkenyl group such as an ethenyl group, an allyl group, an acrylic group, a methacryl group, a propenyl group, a butenyl group, a hexenyl group, and an octenyl group; a cycloalkenyl group such as a cyclopentenyl group and a cyclohexenyl group; and an alkenylaryl group such as a vinylbenzyl group and a vinylnaphthyl group, and a vinylbenzyl group is preferred. The two ethylenic unsaturated groups at both terminals may be the same functional group, or may be different functional groups.

Examples of the modified polyphenylene ether C include the structure represented by the following formula (8).

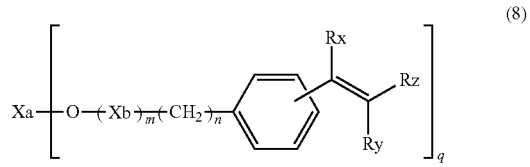

(8)

wherein Xa represents a q-valent aromatic hydrocarbon group; Xb each independently represents a divalent polyphenylene ether moiety; Rx, Ry, and Rz each independently represent a hydrogen atom, an alkyl group, an alkenyl group, or an alkynyl group; m is the number of repeat units of Xb and represents an integer of 1 to 100; n represents an integer of 1 to 6; and q represents an integer of 1 to 4. n is preferably an integer of 1 or more and 4 or less, more preferably 1 or 2, and further preferably 1. q is preferably an integer of 1 or more and 3 or less, more preferably 1 or 2, and further preferably 2.

The modified polyphenylene ether C in this embodiment is preferably represented by the following formula (4).

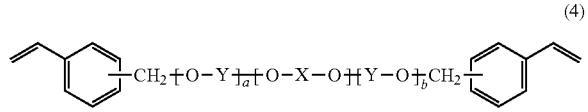

(4)

wherein X represents a group represented by the following formula (5) or the following formula (6); Y each independently represents a group represented by the following formula (7); a and b each independently represent an integer of 0 to 100, and at least one of a and b is 1 or more.

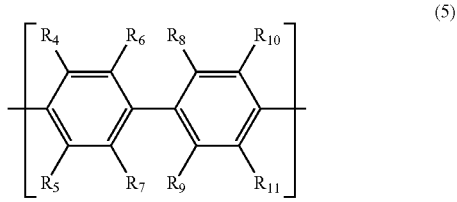
(5)

wherein $R_4$, $R_5$, $R_6$, $R_{10}$, and $R_{11}$ each independently represent a halogen atom, an alkyl group having 1 to 6 carbon atoms, or a phenyl group; and $R_7$, $R_8$, and $R_9$ each independently represent a hydrogen atom, a halogen atom, an alkyl group having 1 to 6 carbon atoms, or a phenyl group.

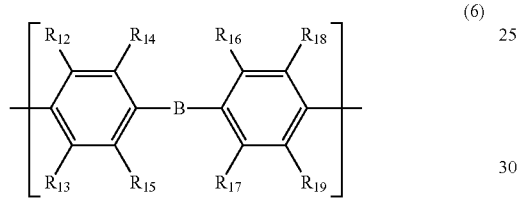
(6)

wherein $R_{12}$, $R_{13}$, $R_{14}$, $R_{15}$, $R_{16}$, $R_{17}$, $R_{18}$, and $R_{19}$ each independently represent a hydrogen atom, a halogen atom, an alkyl group having 1 to 6 carbon atoms, or a phenyl group. —B— represents a linear, branched, or cyclic divalent hydrocarbon group having 1 to 20 carbon atoms.

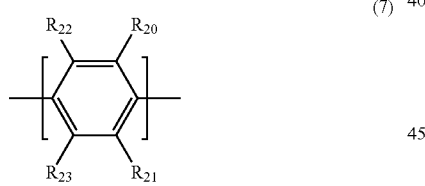
(7)

wherein $R_{20}$ and $R_{21}$ each independently represent a halogen atom, an alkyl group having 1 to 6 carbon atoms, or a phenyl group; and $R_{22}$ and $R_{23}$ each independently represent a hydrogen atom, a halogen atom, an alkyl group having 1 to 6 carbon atoms, or a phenyl group.

Examples of the divalent hydrocarbon group represented by —B— in formula (6) include, but are not particularly limited to, a divalent hydrocarbon group such as methylene, ethylidene, 1-methylethylidene, 1,1-propylidene, 1,4-phenylenebis(1-methylethylidene), 1,3-phenylenebis(1-methylethylidene), cyclohexylidene, phenyl methylene, naphthyl methylene, and 1-phenylethylidene.

In the modified polyphenylene ether C, it is preferred that $R_4$, $R_5$, $R_6$, $R_{10}$, $R_{11}$, $R_{20}$, and $R_{21}$ each independently represent an alkyl group having 1 to 3 carbon atoms (for example, a methyl group, an ethyl group, and a propyl group) in the above formula (5) and the above formula (7), and $R_7$, $R_8$, $R_9$, $R_{12}$, $R_{13}$, $R_{14}$, $R_{15}$, $R_{16}$, $R_{17}$, $R_{18}$, $R_{19}$, $R_{22}$, and $R_{23}$ each independently represent a hydrogen atom or an alkyl group having 1 to 3 carbon atoms (for example, a methyl group, an ethyl group, and a propyl group) in the above formula (5), the above formula (6), and the above formula (7).

In the modified polyphenylene ether C, it is preferred that X represented by the above formula (5) or the above formula (6) have a structure represented by the following formula (9), the following formula (10), or the following formula (11), and Y represented by the above formula (7) have a structure represented by the following formula (12) and/or a structure represented by the following formula (13). When Y represented by the above formula (7) each independently represents the structure represented by the following formula (12) and the structure represented by the following formula (13), the above Y has a structure in which the structure represented by the following formula (12) and the structure represented by the following formula (13) are regularly or randomly arranged.

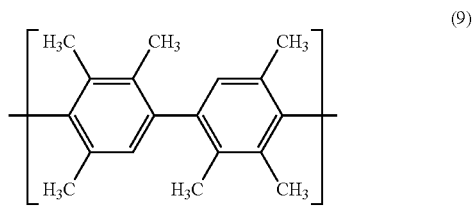
(9)

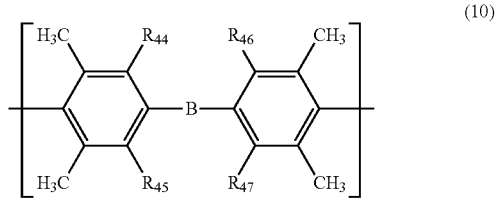
(10)

wherein $R_{44}$, $R_{45}$, $R_{46}$, and $R_{47}$ each independently represent a hydrogen atom or a methyl group. —B— has the same meaning as —B— in formula (6).

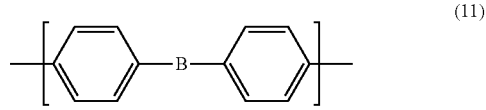
(11)

wherein —B— has the same meaning as —B— in formula (6).

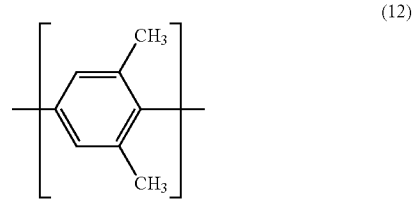
(12)

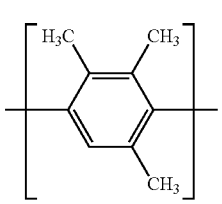

(13)

In the thermosetting composition in this embodiment, the modified polyphenylene ether C may be used singly or in combination of two or more kinds having different structures.

The number average molecular weight of the modified polyphenylene ether C is preferably 500 or more and 3000 or less in terms of polystyrene by the GPC method. With the number average molecular weight is 500 or more, the stickiness tends to be suppressed more upon making the thermosetting composition in this embodiment into a coating film. When the number average molecular weight is 3000 or less, the solubility in a solvent tends to improve more.

The method for preparing (method for producing) the modified polyphenylene ether C represented by formula (4) in this embodiment described above is not particularly limited, and the modified polyphenylene ether C can be produced, for example, by a step of oxidatively coupling a bifunctional phenol compound and a monofunctional phenol compound to obtain a bifunctional phenylene ether oligomer (the oxidative coupling step), and a step of subjecting the obtained terminal phenolic hydroxyl group of a bifunctional phenylene ether oligomer to vinylbenzyl etherification (the vinylbenzyl etherification step). Such a modified polyphenylene ether can be obtained from, for example, Mitsubishi Gas Chemical Company, Inc. (OPE-2St1200 and the like).

In the oxidative coupling step, for example, a bifunctional phenol compound, a monofunctional phenol compound, and a catalyst are dissolved in a solvent, followed by blowing oxygen under heating and stirring to obtain a bifunctional phenylene ether oligomer. Examples of the bifunctional phenol compound include, but are not particularly limited to, at least one selected from the group consisting of 2,2',3,3',5,5'-hexamethyl-(1,1'-biphenol)-4,4'-diol, 4,4'-methylenebis (2,6-dimethylphenol), 4,4'-dihydroxyphenylmethane, and 4,4'-dihydroxy-2,2'-diphenylpropane. Examples of the monofunctional phenol compound include, but are not particularly limited to, 2,6-dimethylphenol and/or 2,3,6-trimethylphenol. Examples of the catalyst include, but are not particularly limited to, copper salts (for example, CuCl, CuBr, CuI, CuCl₂, and CuBr₂), and amines (for example, di-n-butylamine, n-butyldimethylamine, N,N'-di-t-butylethylenediamine, pyridine, N,N,N',N'-tetramethyl ethylene diamine, piperidine, and imidazole), and these can be used singly or in combination of two or more. Examples of the solvent include, but are not particularly limited to, at least one selected from the group consisting of toluene, methanol, methyl ethyl ketone, and xylene.

In the vinylbenzyl etherification step, for example, the bifunctional phenylene ether oligomer obtained in the oxidative coupling step and vinylbenzyl chloride are dissolved in a solvent, followed by adding and reacting a base under heating and stirring, and then solidifying a resin to produce the modified polyphenylene ether C. Examples of the vinylbenzyl chloride include, but are not particularly limited to, at least one selected from the group consisting of o-vinylbenzyl chloride, m-vinylbenzyl chloride, and p-vinylbenzyl chloride. Examples of the base include, but are not particularly limited to, at least one selected from the group consisting of sodium hydroxide, potassium hydroxide, sodium methoxide and sodium ethoxide. In the vinylbenzyl etherification step, acids may be used to neutralize bases remaining after the reaction, and examples of the acid include, but are not particularly limited to, at least one selected from the group consisting of hydrochloric acid, sulfuric acid, phosphoric acid, boric acid, and nitric acid. Examples of the solvent include, but are not particularly limited to, at least one selected from the group consisting of toluene, xylene, acetone, methyl ethyl ketone, methyl isobutyl ketone, dimethylformamide, dimethylacetamide, methylene chloride, and chloroform. Examples of the method of solidifying the resin include a method of evaporating a solvent to dryness and a method of mixing a reaction solution with a poor solvent for reprecipitation.

The content of the modified polyphenylene ether C is preferably 1 to 90 parts by mass, more preferably 5 to 70 parts by mass, further preferably 10 to 50 parts by mass based on 100 parts by mass of the thermosetting compound. When the content of the modified polyphenylene ether C is within the above range, the dielectric constants and the dielectric loss tangent tend to decrease more, and the reactivity tends to improve further more.

[Other Thermosetting Compound]

The thermosetting compound in this embodiment may contain other thermosetting compounds having a thermosetting property, in addition to the cyanate compound A, the maleimide compound B, and the modified polyphenylene ether C. Other thermosetting compounds are not particularly limited as long as they are compounds having at least one or more functional groups capable of undergoing a polymerization reaction or a cross-linking reaction between the same functional groups or different functional groups by heating, in a molecule. Examples of the above functional groups include an epoxy group, a phenolic hydroxy group, an alkenyl-substituted azimide group, an isocyanate group, a hydroxyl group, an amino group, and other polymerizable unsaturated groups.

Examples of other thermosetting compounds include an epoxy compound, a phenolic compound, an oxetane compound, a benzoxazine compound, and a compound having a polymerizable unsaturated group. These other thermosetting compounds are used singly or in combination of two or more. Among these, from the viewpoint of effectively and reliably achieving the effects of the present invention, other thermosetting compounds preferably contain an epoxy compound.

[Epoxy Compound]

The epoxy compound is not particularly limited as long as it is a compound or a resin having two or more epoxy groups in a molecule. Examples of the epoxy compound include bisphenol A-based epoxy resins, bisphenol E-based epoxy resins, bisphenol F-based epoxy resins, bisphenol S-based epoxy resins, phenol novolac-based epoxy resins, bisphenol A novolac-based epoxy resins, glycidyl ester-based epoxy resins, aralkyl novolac-based epoxy resins, biphenyl aralkyl-based epoxy resins, naphthylene ether-based epoxy resins, cresol novolac-based epoxy resins, polyfunctional phenol-based epoxy resins, naphthalene-based epoxy resins, anthracene-based epoxy resins, naphthalene skeleton-modified novolac-based epoxy resins, phenol aralkyl-based epoxy resins, naphthol aralkyl-based epoxy resins, dicyclopentadiene-based epoxy resins, biphenyl-based epoxy resins, alicyclic epoxy resins, polyol-based epoxy resins, phosphorus-containing epoxy resins, compounds obtained by epoxidizing double bonds of glycidyl amines, glycidyl esters, butadiene and the like, and compounds obtained by reaction of hydroxyl group-containing silicone resins and epichlorohydrin. These epoxy compounds can be used singly or in combination of two or more. Among these, from the viewpoint of improving adhesiveness and flexibility more, the epoxy compound is preferably biphenyl aralkyl-based epoxy resins, naphthol aralkyl-based epoxy resins, naphthylene ether-based epoxy resins, polyfunctional phenol-based epoxy resins, naphthalene-based epoxy resins, or naphthalene skeleton-modified novolac-based epoxy resins, and more preferably naphthalene skeleton-modified novolac-based epoxy resins.

The naphthalene skeleton-modified novolac-based epoxy resin may be prepared by a known method, or a commercial product may also be used. Examples of the commercial product include "HP9900" manufactured by DIC Corporation which is represented by the following formula (14).

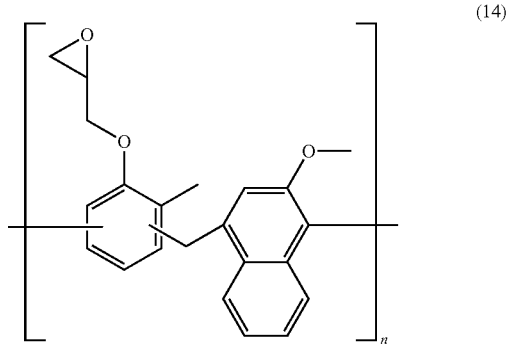

(14)

wherein n represents an integer of 1 or more, preferably an integer of 1 to 30, and more preferably an integer of 1 to 10.

[Phenolic Compound]

The phenolic compound is not particularly limited as long as it is a phenolic compound having two or more hydroxyl groups in a molecule, and examples thereof include bisphenol A-based phenolic resins, bisphenol E-based phenolic resins, bisphenol F-based phenolic resins, bisphenol S-based phenolic resins, phenol novolac resins, bisphenol A novolac-based phenolic resins, glycidyl ester-based phenolic resins, aralkyl novolac-based phenolic resins, biphenyl aralkyl-based phenolic resins, cresol novolac-based phenolic resins, polyfunctional phenolic resins, naphthol resins, naphthol novolac resins, polyfunctional naphthol resins, anthracene-based phenolic resins, naphthalene skeleton-modified novolac-based phenolic resins, phenol aralkyl-based phenolic resins, naphthol aralkyl-based phenolic resins, dicyclopentadiene-based phenolic resins, biphenyl-based phenolic resins, alicyclic phenolic resins, polyol-based phenolic resins, phosphorus-containing phenolic resins, and hydroxyl group-containing silicone resins. These phenolic compounds can be used singly or in combination of two or more.

[Oxetane Compound]

Examples of the oxetane compound include, but are not particularly limited to, oxetane, alkyloxetanes (for example, 2-methyloxetane, 2,2-dimethyloxetane, 3-methyloxetane, and 3,3-dimethyloxetane), 3-methyl-3-methoxymethyloxetane, 3,3-di(trifluoromethyl)perfluoxetane, 2-chloromethyloxetane, 3,3-bis(chloromethyl)oxetane, biphenyl-based oxetane, OXT-101 (manufactured by Toagosei Co., Ltd.), and OXT-121 (a manufactured by Toagosei Co., Ltd.). These oxetane compounds can be used singly or in combination of two or more.

[Benzoxazine Compound]

The benzoxazine compound is not particularly limited as long as it is a compound having two or more dihydrobenzoxazine rings in a molecule, and examples thereof include bisphenol A-based benzoxazine BA-BXZ (manufactured by KONISHI CHEMICAL INC CO., LTD.), bisphenol F-based benzoxazine BF-BXZ (manufactured by KONISHI CHEMICAL INC CO., LTD.), and bisphenol S-based benzoxazine BS-BXZ (manufactured by KONISHI CHEMICAL INC CO., LTD.). These benzoxazine compounds can be used singly or in combination of two or more.

[Compound Having Polymerizable Unsaturated Group]

Examples of the compound having a polymerizable unsaturated group include, but are not particularly limited to, vinyl compounds (for example, ethylene, propylene, styrene, divinylbenzene, and divinylbiphenyl), acrylates (for example, methyl(meth)acrylate), (meth)acrylates of monohydric or polyhydric alcohols (for example, 2-hydroxypropyl(meth)acrylate, polypropylene glycol di(meth)acrylate, trimethylolpropane di(meth)acrylate, trimethylolpropane tri(meth)acrylate, pentaerythritol tetra(meth)acrylate, and dipentaerythritol hexa(meth)acrylate), epoxy(meth)acrylates (for example, bisphenol A-based epoxy(meth)acrylate and bisphenol F-based epoxy(meth)acrylate), and benzocyclobutene resins. These compounds having a polymerizable unsaturated group can be used singly or in combination of two or more.

From the viewpoint of effectively and reliably achieving the effects of the present invention, the content of other curable compounds is preferably 0.1 to 10 parts by mass, and more preferably 0.5 to 5.0 parts by mass based on 100 parts by mass of the thermosetting compound.

[Hexagonal Boron Nitride D]

The thermosetting composition in this embodiment comprises hexagonal boron nitride D, wherein the content of the hexagonal boron nitride D is 0.1 to 25 parts by mass, preferably 0.2 to 20 parts by mass, more preferably 0.3 to 15 parts by mass, and further preferably 0.5 to 10 parts by mass based on 100 parts by mass of the thermosetting compound. When the content of the hexagonal boron nitride D is within the above range, the peel strength, the heat resistance after moisture absorption, the low dielectric constant, the low dielectric loss tangent, the thermal conductivity, the drilling processability, and the moldability are excellent. When the content of the hexagonal boron nitride D is more than 25 parts by mass, the varnish gel time tends to be deteriorated.

In particular, from the viewpoint of the dielectric loss tangent at a low-frequency region and the peel strength, the content of the hexagonal boron nitride D is preferably 0.1 to 5 parts by mass, more preferably 0.1 to 3 parts by mass, and further preferably 0.1 to 2 parts by mass based on 100 parts by mass of the thermosetting compound.

Further in particular, from the viewpoint of the dielectric loss tangent at a high-frequency region and the thermal conductivity, the content of the hexagonal boron nitride D is preferably 5 to 25 parts by mass, more preferably 7.5 to 20 parts by mass, and further preferably 8 to 15 parts by mass based on 100 parts by mass of the thermosetting compound.

The shape of the hexagonal boron nitride D in this embodiment is not particularly limited, and may be, for example, scaly, spherical, elliptical, or polygonal shape, and above all, a scaly shape is preferred. The hexagonal boron nitride D in this embodiment may also be in the form of agglomerated powder in which primary particles of hexagonal boron nitride are agglomerated, or may be in the form in which the surface of hexagonal boron nitride is surface-treated by a silane coupling agent, and the like.

The average particle size of the hexagonal boron nitride D in this embodiment is preferably 0.1 to 20 μm, more preferably 0.1 to 10 μm, further preferably 0.1 to 5 μm, and particularly preferably 0.5 to 3 μm. When the average particle size of the hexagonal boron nitride D is within the above range, the peel strength, the heat resistance after moisture absorption, and the thermal conductivity tend to improve more, and the dielectric constants, the dielectric loss tangent, and the coefficient of thermal expansion tend to decrease more. The average particle size as used herein represents an average particle size of the primary particles of the hexagonal boron nitride D. The average particle size is measured according to, for example, a laser diffraction scattering method.

[Inorganic Filler E]

The thermosetting composition in this embodiment may further comprise an inorganic filler E other than the hexagonal boron nitride D. Examples of the inorganic filler E include, but are not particularly limited to, metal oxides (for example, titanium white, zinc oxide, magnesium oxide, zirconium oxide, and aluminum oxide), heat treated products of aluminum hydroxide (products obtained by subjecting aluminum hydroxide to a heat treatment to reduce a part of crystal water), boehmite, magnesium hydroxide, etc. talc, silica (for example, fused silica, natural silica, synthetic silica, amorphous silica, Aerosil, hollow silica, and white carbon), mica, metal nitrides (for example, boron nitride except the hexagonal boron nitride, aluminum nitride, and aluminum nitride), metal sulfates (for example, barium sulfate), metal hydrates (for example, aluminum hydroxide), molybdenum compounds (for example, molybdenum oxide and zinc molybdate), zinc (for example, zinc borate and zinc stannate), clay, kaolin, E-glass, A-glass, NE-glass, C-glass, L-glass, D-glass, S-glass, M-glass G-20, glass short fibers (including glass fine powders such as E glass, T glass, D glass, S glass, and Q glass), hollow glass, and spherical glass.

These fillers can be used singly or in combination of two or more. Among these, the filler is preferably one or more selected from the group consisting of metal oxides, heat-treated products of aluminum hydroxide, talc, silica, and mica and more preferably one or more selected from the group consisting of aluminum oxide, boehmite, talc, silica, and mica. Especially, from the viewpoint of low thermal expansion properties, low dielectric constant, and low dielectric loss tangent, silica is preferred, and from the viewpoint of high thermal conductivity, alumina or aluminum nitride is preferred.

The average particle size of the inorganic filler E is preferably 0.1 to 10 μm, more preferably 0.1 to 5 μm, further preferably 0.1 to 3 μm, and particularly preferably 0.5 to 3 μm. When the average particle size of the inorganic filler E is within the above range, the peel strength, the heat resistance after moisture absorption, and the thermal conductivity tend to improve more, and the dielectric constants, the dielectric loss tangent, and the coefficient of thermal expansion tend to decrease more. The average particle size as used herein represents an average particle size of the primary particles of the inorganic filler E. The average particle size is measured according to, for example, a laser diffraction scattering method.

The content of the inorganic filler E is not particularly limited, and preferably 1 to 1600 parts by mass, more preferably 10 to 1200 parts by mass, further preferably 50 to 1000 parts by mass, still further preferably 50 to 400 parts by mass, and further more preferably 50 to 200 parts by mass based on 100 parts by mass of the thermosetting compound. When the content of the inorganic filler E is within the above range, the peel strength, the heat resistance after moisture absorption, and the thermal conductivity tend to improve more, and the dielectric constants, the dielectric loss tangent, and the coefficient of thermal expansion tend to decrease more.

When the inorganic filler E is used, the content of the hexagonal boron nitride D is preferably 0.1 to 10 parts by mass, more preferably 0.2 to 8 parts by mass, and further preferably 0.3 to 7 parts by mass based on 100 parts by mass of the inorganic filler E. When the content of the hexagonal boron nitride D in the case of using the inorganic filler E is within the above range, the peel strength, the heat resistance after moisture absorption, and the thermal conductivity tend to improve more, and the dielectric constants, the dielectric loss tangent, and the coefficient of thermal expansion tend to decrease more.

The thermosetting composition in this embodiment may further comprise an organic filler. Examples of the organic filler include, but are not particularly limited to, rubber powder (for example, styrene-based, butadiene-based, acryl-based, and core-shell-type), silicone resin powder, silicone rubber powder, and silicone composite powder.

The thermosetting composition in this embodiment preferably uses a silane coupling agent and/or a wetting and dispersing agent in combination. As the silane coupling agent, for example, one generally used for the surface treatment of an inorganic material is preferred, and examples thereof include aminosilane-based compounds (for example, γ-aminopropyltriethoxysilane and N-β-(aminoethyl)-γ-aminopropyltrimethoxysilane), epoxy silane-based compounds (for example, γ-glycidoxypropyltrimethoxysilane and β-(3,4-epoxycyclohexyl)ethyltrimethoxysilane), vinyl silane-based compounds (for example, γ-methacryloxypropyltrimethoxysilane and vinyl-tri(β-methoxyethoxy)silane), cationic silane-based compounds (for example, N-β-(N-vinylbenzylaminoethyl)-γ-aminopropyltrimethoxysilanehydrochloride), and phenylsilane-based compounds. The silane coupling agent can be used singly or in combination of two or more.

The content of the silane coupling agent is not particularly limited, and for example, may be about 1 to 5 parts by mass based on 100 parts by mass of the thermosetting compound.

As the wetting and dispersing agent, for example, one generally used for paint is preferred, and a copolymer-based wetting and dispersing agent is more preferred. Specific examples of the wetting and dispersing agent include Disperbyk-110, Disperbyk-2009, 111, 161, 180, BYK-W996, BYK-W9010, BYK-W903, and BYK-W940 manufactured by BYK-Chemie Japan. The wetting and dispersing agent can be used singly or in combination of two or more.

The content of the wetting and dispersing agent is not particularly limited, and for example, may be about 0.5 to 5 parts by mass based on 100 parts by mass of the thermosetting compound.

[Curing Accelerator]

The thermosetting composition in this embodiment may contain a curing accelerator for appropriately controlling the curing rate. Examples of the curing accelerator include organic metal salts (for example, zinc octylate, zinc naphthenate, cobalt naphthenate, copper naphthenate, acetylacetone iron, nickel octylate, and manganese octylate), phenolic compounds (for example, phenol, xylenol, cresol, resorcin, catechol, octylphenol, and nonylphenol), alcohols (for example, 1-butanol, and 2-ethylhexanol), imidazoles (for example, 2-methylimidazole, 2-ethyl-4-methylimidazole, 2-phenylimidazole, 1-cyanoethyl-2-phenylimidazole, 1-cyanoethyl-2-ethyl-4-methylimidazole, 2-phenyl-4,5-dihydroxymethylimidazole, 2-phenyl-4-methyl-5-hydroxymethylimidazole, and 2,4,5-triphenylimidazole), and derivatives such as adducts of carboxylic acid or acid anhydrides thereof of these imidazoles, amines (for example, dicyandiamide, benzyl dimethylamine, and 4-methyl-N,N-dimethylbenzylamine), phosphorus compounds (for example, phosphine-based compounds, phosphine oxide-based compounds, phosphonium salt-based compounds, and diphosphine-based compounds), epoxy-imidazole adduct-based compounds, peroxides (for example, benzoyl peroxide, p-chlorobenzoyl peroxide, di-t-butyl peroxide, diisopropyl peroxy carbonate, and di-2-ethylhexyl peroxy carbonate), and azo compounds (for example, azobisisobutyronitrile). The curing accelerator is used singly or in combination of two or more.

The content of the curing accelerator may be generally about 0.005 to 10 parts by mass based on 100 parts by mass of the thermosetting compound.

The thermosetting composition in this embodiment may contain other thermoplastic resins, various polymer compounds such as oligomers of those thermoplastic resins, and various additives, other than the above components. Examples of the additive include retardants, ultraviolet absorbing agents, antioxidants, photopolymerization initiators, fluorescent brightening agents, photosensitizers, dyes, pigments, thickening agents, flow-adjusting agents, lubricants, defoaming agents, dispersing agents, leveling agents, brightening agents, and polymerization inhibitors. These additives can be used singly or in combination of two or more.

[Organic Solvent]

The thermosetting composition in this embodiment may contain an organic solvent. In this case, the thermosetting composition in this embodiment is in a form (solution or varnish) in which at least some, preferably all, of the above-described various components are dissolved in or compatible with the organic solvent. The organic solvent is not particularly limited as long as it is a polar organic solvent or a nonpolar organic solvent that can dissolve or is compatible with at least some, preferably all, of the above-described various components. Examples of the polar organic solvent include ketones (for example, acetone, methyl ethyl ketone, and methyl isobutyl ketone), cellosolves (for example, propylene glycol monomethyl ether and propylene glycol monomethyl ether acetate), esters (for example, ethyl lactate, methyl acetate, ethyl acetate, butyl acetate, isoamyl acetate, ethyl lactate, methyl methoxypropionate, and methyl hydroxyisobutyrate), amides (for example, dimethoxyacetamide and dimethylformamide). Examples of the nonpolar organic solvent include aromatic hydrocarbons (for example, toluene and xylene). These organic solvents are used singly or in combination of two or more.

[Application]

The thermosetting composition in this embodiment can be preferably used as an insulating layer for a printed wiring board and a material for a semiconductor package. The thermosetting composition in this embodiment can be preferably used as a prepreg, a metal foil-clad laminate using the prepreg, a resin sheet, and a material for configuring a printed wiring board.

(Prepreg)

The prepreg in this embodiment comprises a base material; and the thermosetting composition in this embodiment with which the base material is impregnated or coated. The prepreg in this embodiment can be obtained by, for example, impregnating or coating a base material with the thermosetting composition in this embodiment, and then semi-curing the thermosetting composition according to a method of drying at 120 to 220° C. for about 2 to 15 minutes, or the like. In this case, the amount of the thermosetting composition adhered to the base material, that is, the solid content of the thermosetting composition based on the total amount of the prepreg after the semi-curing is preferably in the range of 20 to 99% by mass. The above solid content of the thermosetting composition includes the content of the inorganic filler including the hexagonal boron nitride.

The base material is not particularly limited as long as it is a base material used for various printed wiring board materials. Examples of the material of the base material includes fibers of glass (for example, E glass, D glass, L glass, S glass, T glass, Q glass, UN glass, NE glass, and spherical glass), inorganic fibers other than glass (for example, quartz), organic fibers (for example, polyimides, polyamides, polyesters, and liquid crystal polyesters). Examples of the shape of the base material include, but are not particularly limited to, woven fabrics, nonwoven fabrics, rovings, chopped strand mats, and surfacing mats. These base materials can be used singly or two or more in combination. Among these base materials, woven fabrics subjected to ultra-opening treatment or clogging treatment are preferred from the viewpoint of dimensional stability glass woven fabrics surface-treated with silane coupling agents for epoxy silane treatment, amino silane treatment, or the like are preferred from the viewpoint of heat resistance after moisture absorption; and liquid crystal polyester woven fabrics are preferred from the viewpoint of low dielectric loss tangent. The thickness of the base material is not particularly limited, and for example, may be about 0.01 to 0.2 mm.

(Metal Foil-Clad Laminate)

The metal foil-clad laminate in this embodiment comprises at least one or more of the prepregs in this embodiment laminated; and metal foil disposed on one surface or both surfaces of the prepreg. The metal foil-clad laminate in this embodiment can be fabricated by, for example, a method of stacking at least one or more prepregs in this embodiment, disposing metal foil on one surface or both surfaces thereof, followed by laminate-molding, and more specifically, it can be fabricated by disposing metal foil such as cooper or aluminum on one surface or both surfaces thereof, followed by laminate-molding. The metal foil is not particularly limited as long as it is one used for a printed wiring board material, and examples thereof include copper foil such as rolled copper foil and electrolytic copper foil. The thickness of the copper foil is not particularly limited and may be about 2 to 70 μm. Examples of the molding method include methods generally used when laminates and multilayer boards for printed wiring boards are molded, and more specifically, a method of laminate-molding at a temperature of about 180 to 350° C., a heating time of about 100 to 300 minutes, and a surface pressure of about 20 to 100 kg/cm$^2$ using a multistage press, a multistage vacuum press, a continuous molding machine, an autoclave molding machine, or the like. In addition, a multilayer board can also be fabricated by laminate-molding the prepreg in this embodiment and a separately fabricated wiring board for an inner layer in combination. As the method for producing a multilayer board, for example, about 35 μm copper foil is disposed on both surfaces of one of the prepregs in this embodiment, the copper foil and the prepreg are laminate-molded according to the above molding method, then inner layer circuits are formed, and these circuits are subjected to blackening treatment to form inner layer circuit boards, and thereafter, this inner layer circuit board and the prepreg in this embodiment are alternately disposed one by one, copper foil is further disposed on the outermost layer, and the copper foil, the inner layer circuit boards, the prepregs are laminate-molded under the above conditions preferably under vacuum, and thus a multilayer board can be fabricated. The metal foil-clad laminate in this embodiment can be preferably used as a printed wiring board.

(Printed Wiring Board)

The printed wiring board in this embodiment comprises an insulating layer; and a conductor layer formed on a surface of the insulating layer, wherein the insulating layer comprises the thermosetting composition in this embodiment. Such a printed wiring board can be produced according to an ordinary method, and the method for producing the printed wiring board is not particularly limited. One example of a method for producing a printed wiring board will be shown below. First, the above-described metal foil-clad laminate such as copper-clad laminate is provided. Next, the surfaces of the metal foil-clad laminate are subjected to etching treatment to form inner layer circuits to fabricate an inner layer board. The inner layer circuit surfaces of this inner layer board are subjected to surface treatment for increasing adhesive strength, as needed, then the required number of the above-described prepregs are stacked on the inner layer circuit surfaces, and further, metal foil for outer layer circuits is laminated on the outside of the stack, and heat and pressure are applied for integral molding. In this manner, a multilayer laminate in which insulating layers comprising a base material and a cured product of a thermosetting composition are formed between inner layer circuits and metal foil for outer layer circuits is produced. Then, this multilayer laminate is subjected to perforation for through holes and via holes, and then plating metal films that allow conduction between the inner layer circuits and the metal foil for outer layer circuits are formed on the wall surfaces of these holes. Further, the metal foil for outer layer circuits is subjected to etching treatment to form outer layer circuits, and thus, a printed wiring board is produced.

The printed wiring board obtained in the above production example has a configuration in which it has insulating layers and conductor layers formed on surfaces of these insulating layers, and the insulating layers comprise the thermosetting composition in this embodiment described above. In other words, the prepreg in this embodiment described above (the base material and the thermosetting composition in this embodiment with which the base material is impregnated or coated) and the thermosetting composition layer of the metal foil-clad laminate in this embodiment described above are composed of an insulating layer comprising the thermosetting composition in this embodiment.

(Resin Sheet)

The resin composite sheet in this embodiment comprises a support; and the thermosetting composition in this embodiment disposed on a surface of the support. The resin composite sheet can be used as a buildup film or a dry film solder resist. The method of producing the resin composite sheet includes, but is not particularly limited to, a method of obtaining a resin composite sheet by coating a support with a solution of the above thermosetting composition in this embodiment dissolved in a solvent (applying the solution to the support), and then drying.

Examples of the support include organic film base materials such as polyethylene films, polypropylene films, polycarbonate films, polyethylene terephthalate films, ethylene-tetrafluoroethylene copolymer films, and release films obtained by coating surfaces of these films with release agents, and polyimide films; conductor foil such as copper foil and aluminum foil; and plate-shaped films such as glass plate, SUS plates, and FRP, but are not particularly limited thereto.

Examples of the coating method (applying method) include a method of coating a support with a solution of the thermosetting composition in this embodiment dissolved in a solvent by a bar coater, a die coater, a doctor blade, a baker applicator, or the like. In addition, a single-layer sheet (resin sheet) can also be obtained by peeling or etching the support from the resin sheet on which supports and thermosetting compositions are laminated after drying. A single-layer sheet (resin sheet) can also be obtained without using a support by supplying a solution of the above thermosetting composition in this embodiment dissolved in a solvent into a mold having a sheet-shaped cavity, and drying the solution, or the like for molding into a sheet shape.

In fabrication of the single-layer sheet or the resin composite sheet in this embodiment, the drying conditions when the solvent is removed are not particularly limited, but drying is preferably performed at a temperature of 20° C. to 200° C. for 1 to 90 minutes, because the solvent tends to remain in the thermosetting composition at low temperature and curing of the thermosetting composition proceeds at high temperature. In the single-layer sheet or the resin composite sheet, the thermosetting composition can also be used in an uncured state in which the solvent is only dried, or in a semi-cured (B-staged) state, as needed. In addition, the thickness of the resin layer in the single-layer sheet or the resin composite sheet in this embodiment can be adjusted by the concentration and coating thickness of the solution of the thermosetting composition in this embodiment, and is preferably, but is not particularly limited to, 0.1 to 500 μm because a thicker coating thickness typically allows the solvent to easily remain during drying.

EXAMPLES

Hereinafter, the present invention will be described in more detail based on Synthesis Examples, Examples, and Comparative Examples, but the present invention is not limited thereto.

(Synthesis Example 1) Synthesis of Cyanate Compound (SNCN)

300 g (1.28 mol in terms of OH groups) of a 1-naphthol aralkyl resin (manufactured by NIPPON STEEL & SUMIKIN CHEMICAL CO., LTD.) and 194.6 g (1.92 mol) (1.5 mol based on 1 mol of hydroxy groups) of triethylamine were dissolved in 1800 g of dichloromethane, and this solution was a solution A. While 125.9 g (2.05 mol) (1.6 mol based on 1 mol of hydroxy groups) of cyanogen chloride, 293.8 g of dichloromethane, 194.5 g (1.92 mol) (1.5 mol based on 1 mol of hydroxy groups) of 36% hydrochloric acid, and 1205.9 g of water were kept at a liquid temperature of −2 to −0.5° C. under stirring, the solution A was poured over 30 minutes. After completion of pouring of the solution A, the mixture was stirred at the same temperature for 30 minutes, and then a solution of 65 g (0.64 mol) (0.5 mol based on 1 mol of hydroxy groups) of triethylamine dissolved in 65 g of dichloromethane (solution B) was poured over 10 minutes. After completion of pouring of the solution B, the mixture was stirred at the same temperature for 30 minutes to complete the reaction. Then, the reaction liquid was allowed to stand to separate the organic phase and the aqueous phase. The obtained organic phase was washed five times with 1300 g of water. The electrical conductivity of the wastewater from the fifth water washing was 5 μS/cm, and it was confirmed that removable ionic compounds were sufficiently removed by the washing with water. The organic phase after the water washing was concentrated under reduced pressure and finally concentrated to dryness at 90° C. for 1 hour to obtain 331 g of the target naphthol aralkyl-based cyanate compound (SNCN) (orange viscous material). The mass average molecular weight Mw of the obtained SNCN was 600. In addition, the IR spectrum of SNCN showed absorption at 2250 cm$^{-1}$ (cyanate groups) and showed no absorption of hydroxy groups.

(Synthesis of Bifunctional Phenylene Ether Oligomer)

A 12 L vertical reactor equipped with a stirring apparatus, a thermometer, an air introduction pipe, and a baffle plate was charged with 9.36 g (42.1 mmol) of CuBr$_2$, 1.81 g (10.5 mmol) of N,N'-di-t-butylethylenediamine, 67.77 g (671.0 mmol) of n-butyldimethylamine, and 2,600 g of toluene, which were stirred at a reaction temperature of 40° C. A mixed solution, which was obtained by previously dissolving 129.32 g (0.48 mol) of 2,2',3,3',5,5'-hexamethyl-(1,1'-biphenol)-4,4'-diol, 878.4 g (7.2 mol) of 2,6-dimethylphenol, 1.22 g (7.2 mmol) of N,N'-di-t-butylethylenediamine, 26.35 g (260.9 mmol) of n-butyldimethylamine in 2,300 g of methanol, was dropped to the reactor over 230 minutes while carrying out bubbling with a nitrogen-air mixed gas having an adjusted oxygen concentration of 8% at a flow rate of 5.2 L/min, and stirring was performed. After completion of the dropping, 1,500 g of water in which 48.06 g (126.4 mmol) of tetrasodium ethylenediamine tetraacetate was dissolved was added to the stirred mixture to terminate the reaction. The aqueous layer and the organic layer were separated and the organic layer was washed with an aqueous 1 N hydrochloric acid solution and then washed with pure water. The obtained solution was concentrated to 50 mass % using an evaporator to obtain 1981 g of a toluene solution of a bifunctional phenylene ether oligomer (resin "A"). The resin "A" had a number average molecular weight of 1975 in terms of polystyrene by the GPC method, a weight average molecular weight of 3514 in terms of polystyrene by the GPC method, and a hydroxyl group equivalent of 990.

(Synthesis of Modified Polyphenylene Ether (OPE-2St1200))

A reactor equipped with a stirring apparatus, a thermometer, and a reflux pipe was charged with 833.4 g of the toluene solution of resin "A", 76.7 g of vinyl benzyl chloride ("CMS-P" manufactured by AGC SEIMI CHEMICAL CO., LTD.), 1,600 g of methylene chloride, 6.2 g of benzyldimethylamine, 199.5 g of pure water, and 83.6 g of a 30.5% by mass aqueous NaOH solution, which were stirred at a reaction temperature of 40° C. After stirring for 24 hours, the organic layer was washed with an aqueous 1 N hydrochloric acid solution and then washed with pure water. The obtained solution was concentrated using an evaporator, dropped into methanol for solidification, and the solid was recovered by filtration and dried in vacuum to obtain 450.1 g of modified polyphenylene ether (OPE-2St1200). The modified polyphenylene ether C had a number average molecular weight of 2250 in terms of polystyrene by the GPC method, a weight average molecular weight of 3920 in terms of polystyrene by the GPC method, and a vinyl group equivalent of 1189 g/vinyl group.

Example 1

54.0 parts by mass of the cyanate compound (SNCN) obtained in Synthesis Example 1, 23.0 parts by mass of the maleimide compound represented by the following formula (1x) ("BMI-70" manufactured by K•I Chemical Industry Co., LTD.), 3.0 parts by mass of a naphthalene skeleton-modified novolac-based epoxy resin ("HP-9900" manufactured by DIC Corporation), 20.0 parts by mass of the modified polyphenylene ether obtained in Synthesis Example 2, 1.0 part by mass of a wetting and dispersing agent A ("disperbyk-161" manufactured by BYK-Chemie Japan), 0.3 parts by mass of a wetting and dispersing agent B ("disperbyk-2009" manufactured by BYK-Chemie Japan), 2.5 parts by mass of a silane coupling agent ("KBM-403" manufactured by Shin-Etsu Silicone Co., Ltd.), 50 parts by mass of a fused silica slurry ("SC2050-MB" manufactured by Admatechs Company Limited, an average particle diameter of 0.7 μm), 50 parts by mass of fused silica ("SFP-330MC" manufactured by Denka Company Limited, an average particle diameter of 0.7 μm), 50 parts by mass of fused silica ("SC4500SQ" manufactured by Admatechs Company Limited, 1.3 μm), 0.53 parts by mass of scaly hexagonal boron nitride ("MBN-010T" manufactured by Mitsui Chemicals, Inc., an average particle size of 0.9 μm), 0.5 parts by mass of TPIZ (2,4,5-triphenylimidazole), and 0.1 parts by mass of zinc octylate (manufactured by Nihon Kagaku Sangyo Co., Ltd.) were dissolved in methyl ethyl ketone and mixed to obtain varnish. The amount of each component added indicates the amount excluding the solvent from each component (the solid content), and the same applies to Examples 2 to 3 and Comparative Examples 1 to 2 below. This varnish was further diluted with methyl ethyl ketone, impregnated and applied to a NE-glass woven fabric having a thickness of 0.1 mm, and heated and dried at 150° C. for 5 minutes to obtain a prepreg having a resin content of 60% by mass.

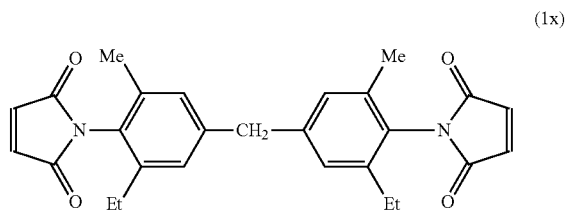 [SMILES: CCc1cc(Cc2cc(C)c(N3C(=O)C=CC3=O)c(CC)c2)cc(C)c1N1C(=O)C=CC1=O]

(1x)

Example 2

A prepreg was obtained in the same manner as in Example 1 except that the amount of the hexagonal boron nitride added was changed from 0.53 parts by mass to 5.00 parts by mass.

Example 3

A prepreg was obtained in the same manner as in Example 1 except that the amount of the hexagonal boron nitride added was changed from 0.53 parts by mass to 10.0 parts by mass.

Comparative Example 1

A prepreg was obtained in the same manner as in Example 1 except that no hexagonal boron nitride was added.

Comparative Example 2

A prepreg was obtained in the same manner as in Example 1 except that the amount of the hexagonal boron nitride added was changed from 0.53 parts by mass to 60.0 parts by mass.

The viscosity of each varnish obtained in Examples 1 to 3 and Comparative Example 1 at 120° C. was measured using a Capillary Rheometer. The measured values are shown in Table 1. The viscosity of the varnish obtained in Comparative Example 2 was also tried to measure under the same conditions; however, the viscosity was too high to be measured.

Eight of prepregs obtained in each Example and Comparative Example were stacked, and 12 μm electrolytic copper foils (3EC-M3-VLP, manufactured by MITSUI MINING & SMELTING CO., LTD.) were disposed on the top and the bottom surfaces, and the stack was laminate-molded at a pressure of 30 kgf/cm² and a temperature of 220° C. for 120 minutes to obtain a metal foil-clad laminate having an insulating layer thickness of 0.8 mm. Evaluations of the copper foil peel strength, the heat resistance after moisture absorption, the dielectric constants, the dielectric loss tangent, and the thermal conductivity were performed using the obtained metal foil-clad laminate. The evaluation results are shown in Table 1.
(Measurement Method and Evaluation Method)
(1) Copper Foil Peel Strength:

The peeling strength of the copper foil was measured in accordance with JIS C6481 using the metal foil-clad laminate.
(2) Heat Resistance after Moisture Absorption:

The copper foil on the metal foil-clad laminate was removed by etching, and then three test specimens with 50×50 mm were fabricated. Each of three test specimens fabricated was dried at 120° C. for 1 hour in a drier and allowed to stand under the conditions of 121° C. and 2 atm for 5 hours using a pressure cooker test apparatus (manufactured by HIRAYAMA Manufacturing Corporation). Thereafter, each test specimen was charged into a solder bath at 260° C. for 1 minute, and the heat resistance after moisture absorption was evaluated by confirming the occurrence of delamination. The evaluation criteria are as follows.
(Evaluation Criteria)
A: No delamination was occurred in any of three test specimens.
B: Among three test specimens, delamination was observed in one test specimen.
C: Among three test specimens, delamination was observed in two or more test specimens.
(3) Dielectric Loss Tangents (Df):

The dielectric loss tangent (Df) at 2 GHz and 10 GHz were measured by a perturbation method cavity resonator (Agilent 8722ES manufactured by Agilent Technologies) using a sample in which the copper foil on the metal foil-clad laminate was removed by etching.
(4) Thermal Conductivity:

The density, the specific heat, and the thermal diffusivity of the metal foil-clad laminate were measured. The specific heat was measured by a DSC (TA instrument model Q100), and the thermal diffusivity of each of the plane direction (XY direction) and the thickness direction (Z direction) of the metal foil-clad laminate was measured by a xenon flash analyzer (Bruker: LFA447 Nanoflash). The thermal conductivity was calculated from the following formula. In Table 1, the XY direction represents the thermal conductivity of the plane direction of the metal foil-clad laminate, and Z direction represents the thermal conductivity of the thickness direction of the metal foil-clad laminate.

$$\text{thermal conductivity (W/m·K)} = \text{density (kg/m}^3\text{)} \times \text{specific heat (kj/kg·K)} \times \text{thermal diffusivity (m}^2\text{/S)} \times 1000$$

(5) Moldability:

The varnish obtained in each Example and Comparative Example was placed on a hot plate at 170° C. and the time required for curing (varnish gel time) was measured. Here, the above varnish was stirred with torque, and it was determined that the varnish was cured at the time when the torque was not rotated any more, as the cure criteria. When the varnish gel time was 200 seconds or more, it was indicated with ○, and when the varnish gel time was less than 200 seconds, it was indicated with x. The results are shown in Table 1.
(6) Drilling Processability:

Two of prepregs obtained in each Example and Comparative Example were stacked, and 12 μm electrolytic copper foils (3EC-M3-VLP, manufactured by MITSUI MINING & SMELTING CO., LTD.) were disposed on the top and the bottom surfaces, and the stack was laminate-molded at a pressure of 30 kgf/cm² and a temperature of 220° C. for 120 minutes to obtain a metal foil-clad laminate having an insulating layer thickness of 0.2 mm. Four of metal foil-clad laminates obtained in each Example and Comparative Example were stacked and drilled by ND-1 V212 (manufactured by Hitachi Via Mechanics, Ltd.) using PS-1160G (manufactured by Risho Kogyo Co., Ltd.) as a backup board and LE450 (manufactured by Mitsubishi Gas Chemical Company, Inc.) as an entry sheet, at a rotational speed of 2000 krpm and a feeding speed of 2.0 m/min, hole positions (μm) of 1 to 5000 holes were measured with an analyzer, and the drilling processability was evaluated based on the measured value. The evaluation criteria are as follows. The evaluation results are shown in Table 1. In Table 1, the numerical values in the item of the drilling processability represent the average value obtained by measuring hole positions of 1 to 5000 holes.
(Evaluation Criteria)
A: The accuracy of the hole position (hole position accuracy) was less than 20 μm.
C: The accuracy of the hole position (hole position accuracy) was 20 μm or more.

TABLE 1

|  |  | Example 1 | Example 2 | Example 3 | Comparative Example 1 | Comparative Example 2 |
| --- | --- | --- | --- | --- | --- | --- |
| Varnish gel time | seconds | ○ | ○ | ○ | ○ | X |
| Viscosity | Pa · s | 486.9 | 509.6 | 311.6 | 303.2 | not measurable |

TABLE 1-continued

|  |  | Example 1 | Example 2 | Example 3 | Comparative Example 1 | Comparative Example 2 |
|---|---|---|---|---|---|---|
| Peel strength | kg/cm | 0.80 | 0.77 | 0.77 | 0.72 | 0.42 |
| Heat resistance after moisture absorption | Evaluation | A | A | A | B | C |
| Dielectric loss tangent | 2 GHZ | 0.00279 | 0.00285 | 0.00286 | 0.00300 | 0.00270 |
|  | 10 GHZ | 0.00399 | 0.00396 | 0.00394 | 0.00410 | 0.00370 |
| Thermal conductivity W/m · K | Z direction | 0.51 | 0.54 | 0.56 | 0.52 | 0.83 |
|  | XY direction | 0.62 | 0.63 | 0.67 | 0.62 | 1.03 |
| Drilling processability | μm | 18.7 | 17.9 | 19.0 | 23.5 | — |
|  | Evaluation | A | A | A | C | — |

When the content of the hexagonal boron nitride was more than 25 parts by mass based on 100 parts by mass of the thermosetting compound, the varnish gel time tended to deteriorate gradually.

INDUSTRIAL APPLICABILITY

The thermosetting composition of the present invention can be widely and effectively used, for example, as an electrical insulating material, a semiconductor plastic package, a sealing material, an adhesive, a laminate material, a resist, and a build-up laminate material or the like, in various applications such as electrical and electronic materials, machine tool materials, and aviation materials, and especially, it can be particularly effectively used as a printed wiring board material which is applicable to high integration and densification of recent information terminal devices or communication devices or the like. The laminate, the metal foil-clad laminate, and the like of the present invention have particularly excellent peel strength, heat resistance after moisture absorption, and drilling processability, and therefore, their industrial practicality is extremely high.

The invention claimed is:

1. A thermosetting composition comprising:
   a thermosetting compound; and
   a hexagonal boron nitride D,
   wherein the thermosetting compound contains a cyanate compound A and/or a maleimide compound B, and a modified polyphenylene ether C having a substituent with a carbon-carbon unsaturated double bond at at least one terminal, and
   a content of the hexagonal boron nitride D is 0.1 parts by mass or more and 25 parts by mass or less based on 100 parts by mass of the thermosetting compound.

2. The thermosetting composition according to claim 1 further comprising an inorganic filler E other than the hexagonal boron nitride D,
   wherein the inorganic filler E contains one or more selected from the group consisting of aluminum oxide, boehmite, talc, silica, and mica.

3. The thermosetting composition according to claim 2, wherein a content of the inorganic filler E is 1 to 1600 parts by mass based on 100 parts by mass of the thermosetting compound.

4. The thermosetting composition according to claim 1, wherein the cyanate compound A contains at least one cyanate compound of a naphthol aralkyl-based cyanate compound represented by following formula (1) and a biphenyl aralkyl-based cyanate compound represented by following formula (2),

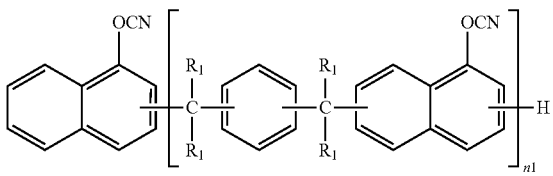

wherein $R_1$ each independently represents a hydrogen atom or a methyl group; and n1 represents an integer of 1 to 50,

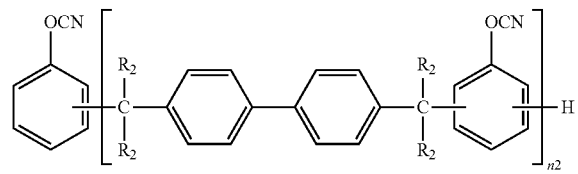

wherein $R_2$ each independently represents a hydrogen atom or a methyl group; and n2 represents an integer of 1 to 50.

5. The thermosetting composition according to claim 1, wherein a content of the cyanate compound A is 1 to 90 parts by mass based on 100 parts by mass of the thermosetting compound.

6. The thermosetting composition according to claim 1, wherein the maleimide compound B contains one or more selected from the group consisting of 2,2-bis(4-(4-maleimidophenoxy)-phenyl) propane, bis(3-ethyl-5-methyl-4-maleimidophenyl) methane, and a maleimide compound represented by following formula (3),

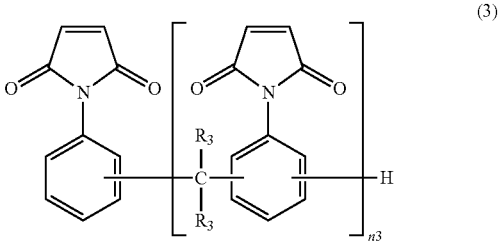

wherein $R_3$ each independently represents a hydrogen atom or a methyl group; and n3 represents an integer of 1 or more.

7. The thermosetting composition according to claim 1, wherein a content of the maleimide compound B is 1 to 90 parts by mass based on 100 parts by mass of the thermosetting compound.

8. The thermosetting composition according to claim 1, wherein the modified polyphenylene ether C contains a compound represented by following formula (4),

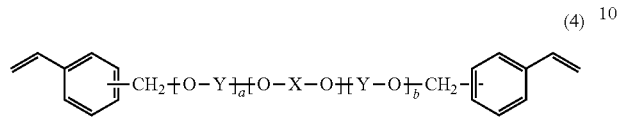

(4)

wherein X represents a group represented by following formula (5) or following formula (6); Y each independently represents a group represented by following formula (7); a and b each independently represent an integer of 0 to 100, and at least one of a and b is 1 or more,

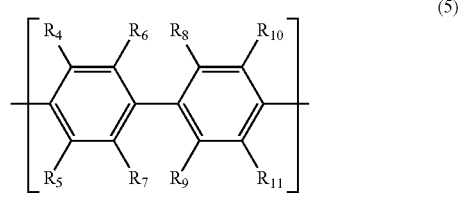

(5)

wherein $R_4$, $R_5$, $R_6$, $R_{10}$, and $R_{11}$ each independently represent a halogen atom, an alkyl group having 1 to 6 carbon atoms, or a phenyl group; and $R_7$, $R_8$, and $R_9$ each independently represent a hydrogen atom, a halogen atom, an alkyl group having 1 to 6 carbon atoms, or a phenyl group,

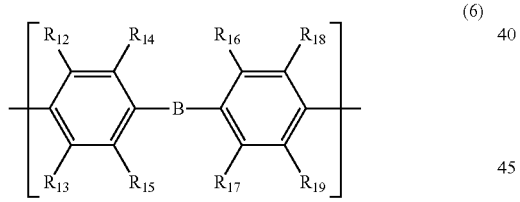

(6)

wherein $R_{12}$, $R_{13}$, $R_{14}$, $R_{15}$, $R_{16}$, $R_{17}$, $R_{18}$, and $R_{19}$ each independently represent a hydrogen atom, a halogen atom, an alkyl group having 1 to 6 carbon atoms, or a phenyl group; and —B— represents a linear, branched, or cyclic divalent hydrocarbon group having 1 to 20 carbon atoms,

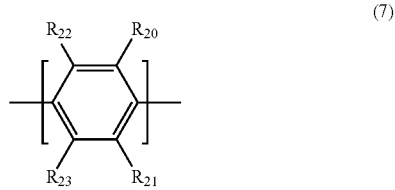

(7)

wherein $R_{20}$ and $R_{21}$ each independently represent a halogen atom, an alkyl group having 1 to 6 carbon atoms, or a phenyl group; and $R_{22}$ and $R_{23}$ each independently represent a hydrogen atom, a halogen atom, an alkyl group having 1 to 6 carbon atoms, or a phenyl group.

9. The thermosetting composition according to claim 1, wherein a content of the modified polyphenylene ether C is 1 to 90 parts by mass based on 100 parts by mass of the thermosetting compound.

10. The thermosetting composition according to claim 1, wherein a content of the hexagonal boron nitride D is 0.3 parts by mass or more and 15 parts by mass or less based on 100 parts by mass of the thermosetting compound.

11. A prepreg comprising:
a base material; and
the thermosetting composition according to claim 1 with which the base material is impregnated or coated.

12. A metal foil-clad laminate comprising:
at least one or more of the prepreg according to claim 11 laminated; and
a metal foil disposed on one surface or both surfaces of the prepreg.

13. A resin sheet comprising:
a support, and
the thermosetting composition according to claim 1 disposed on a surface of the support.

14. A printed wiring board comprising:
an insulating layer; and
a conductor layer formed on a surface of the insulating layer,
wherein the insulating layer comprises the thermosetting composition according to claim 1.

* * * * *